United States Patent
Goshima et al.

(10) Patent No.: US 6,924,534 B2
(45) Date of Patent: Aug. 2, 2005

(54) SEMICONDUCTOR DEVICE HAVING MOS TRANSISTORS AND BIPOLAR TRANSISTORS ON A SINGLE SEMICONDUCTOR SUBSTRATE

(75) Inventors: Kazutomo Goshima, Oizumi-machi (JP); Toshiyuki Ohkoda, Oizumi-machi (JP); Toshimitsu Taniguchi, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/816,188

(22) Filed: Apr. 2, 2004

(65) Prior Publication Data

US 2004/0256678 A1 Dec. 23, 2004

(30) Foreign Application Priority Data

Apr. 7, 2003 (JP) ..................................... 2003-102692

(51) Int. Cl.[7] .................. H01L 29/76; H01L 29/94; H01L 31/062; H01L 31/113; H01L 31/119
(52) U.S. Cl. ..................................... 257/370; 257/378
(58) Field of Search ................... 257/370, 371, 257/373, 378; 438/202, 205, 234, 309

(56) References Cited

U.S. PATENT DOCUMENTS 6,649,983 B2 * 11/2003 Chatterjee .................. 257/370

* cited by examiner

Primary Examiner—Hoai Pham
(74) Attorney, Agent, or Firm—Morrison & Foerster LLP

(57) ABSTRACT

The invention is directed to reducing of the number of steps in a BiCMOS process. A first N-well 3A and a second N-well 3B are formed deeply on a surface of a P-type semiconductor substrate. A first P-well 4A is formed in the first N-well 3A, and an N-channel MOS transistor is formed in the first P-well 4A. The second N-well 3B is used as a collector of a vertical NPN bipolar transistor. A second P-well 4B is formed in the second N-well 3B. The second P-well 4B is formed simultaneously with the first P-well 4A. The second P-well 4B is used as a base of the vertical NPN bipolar transistor. An N+ emitter layer and a P+ base electrode layer of the vertical NPN bipolar transistor are formed on a surface of the second P-well 4B.

5 Claims, 3 Drawing Sheets

SEMICONDUCTOR DEVICE HAVING MOS TRANSISTORS AND BIPOLAR TRANSISTORS ON A SINGLE SEMICONDUCTOR SUBSTRATE

BACKGROUND OF THE INVENTION

This application is based on Japanese Patent Application No. 2003-102692, and the description thereof is herein incorporated by reference.

1. Field of the Invention

This invention relates to a semiconductor device, particularly to a semiconductor device having MOS transistors and bipolar transistors on a single semiconductor device.

2. Description of the Related Art

In recent years, an analog-digital mixed signal LSI, which integrates an analog circuit and a digital circuit, has been developed. In such an LSI, the analog circuit is mainly configured of bipolar transistors, and the digital circuit is mainly configured of MOS transistors. For forming the MOS transistors and the bipolar transistors on a single semiconductor substrate, a BiCMOS process where a bipolar process and a CMOS process are combined is used.

Conventionally, since the BiCMOS process has significantly more steps than the CMOS process, the cost and time for manufacturing the LSI highly increases accordingly. Japanese Patent Application Publication No. 2000-3972 discloses a technology for reducing steps by forming a bipolar transistor by a triple-well CMOS process.

However, in the conventional art the base of the bipolar transistor is formed by a series of process steps in addition to the process steps to form the MOS transistor.

SUMMARY OF THE INVENTION

In the invention, bipolar transistors of various types are formed by the triple-well CMOS process without adding additional process steps. First, an N-well is formed on a surface of a P-type semiconductor substrate and a P-channel transistor is formed in the N-well. Furthermore, a P-well is formed in the N-well and an N-channel transistor is formed in the P-well. Then, the N-well is used as a collector of a vertical NPN bipolar transistor. Furthermore, the P-well is used as a base of the vertical NPN bipolar transistor or a lateral NPN bipolar transistor.

DETAILED DESCRIPTION OF THE INVENTION

Figure 1:
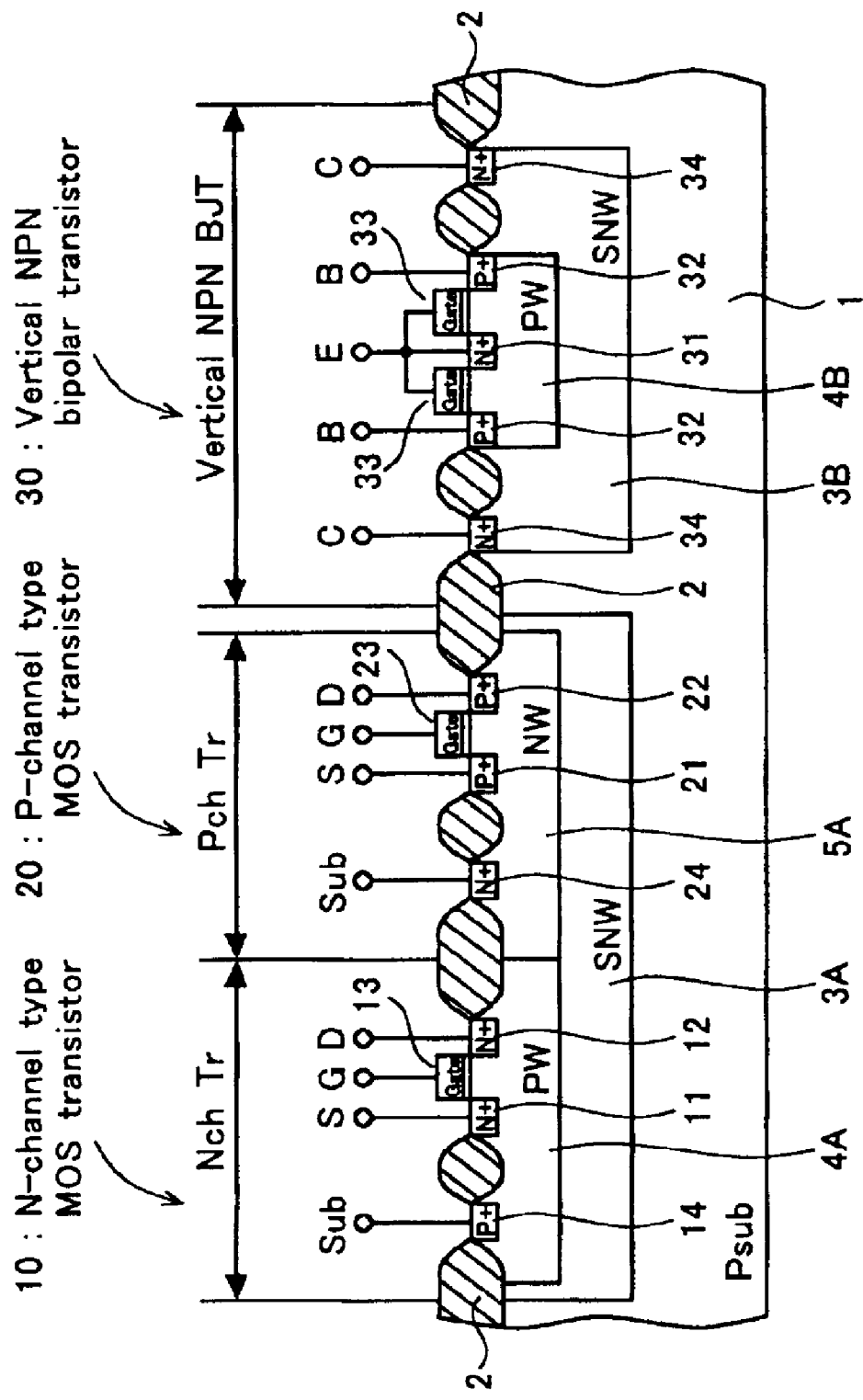
FIG. 1 is a cross-sectional view of a semiconductor device of an embodiment of the invention.
Figure 2:
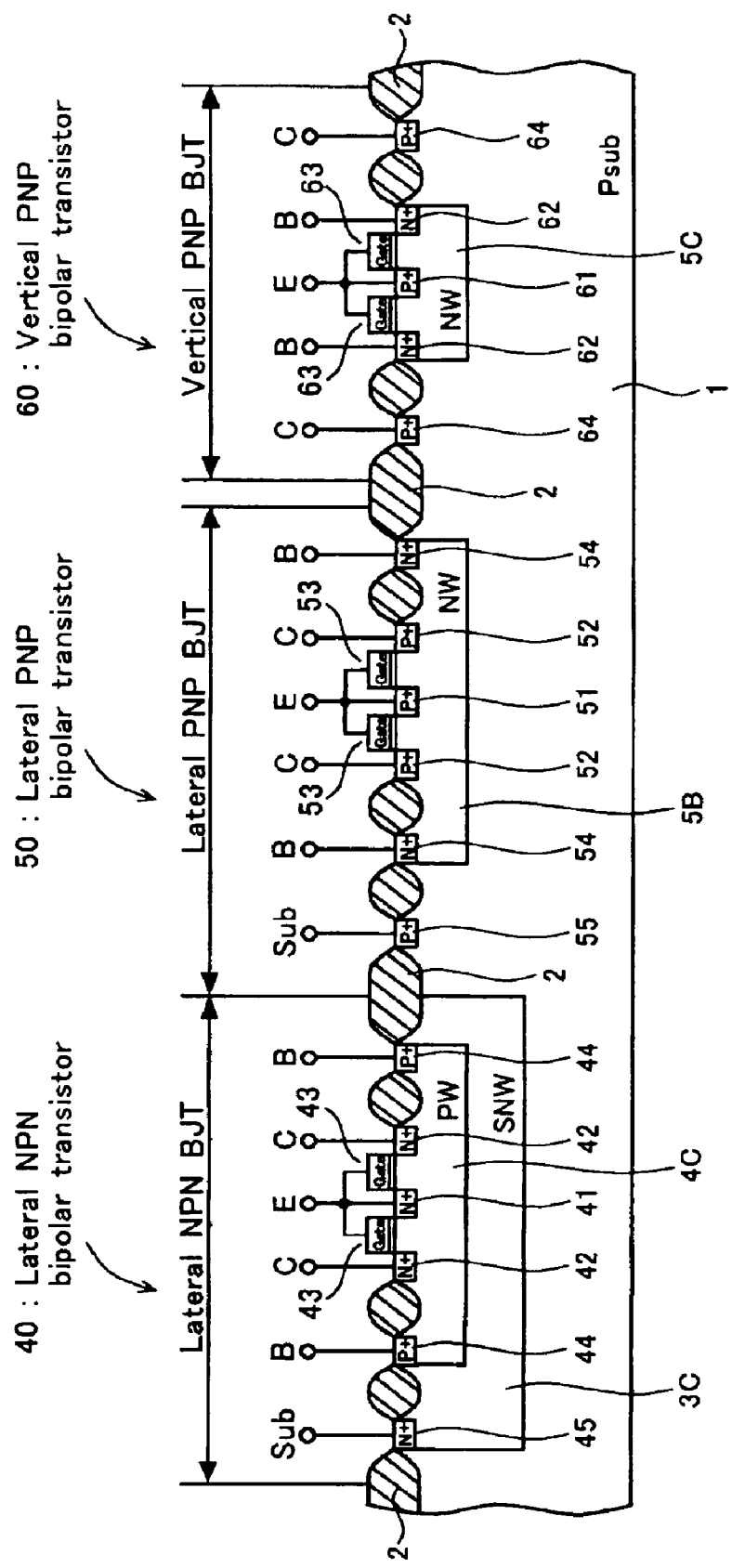
FIG. 2 is a cross-sectional view of the semiconductor device of FIG. 1 to show other portion of the same semiconductor device.

A semiconductor device of an embodiment of the invention will be described with reference to the drawings in detail. FIGS. 1 and 2 are cross-sectional views of the semiconductor device of the embodiment of the invention. FIG. 1 shows an N-channel MOS transistor 10, a P-channel MOS transistor 20 and a vertical NPN bipolar transistor 30. FIG. 2 shows a lateral NPN bipolar transistor 40, a lateral PNP bipolar transistor 50, and a vertical PNP bipolar transistor 60. These two MOS transistors and the four bipolar transistors are formed on the same semiconductor substrate 1.

Next, a structure and a manufacturing method of the N-channel MOS transistor 10, the P-channel MOS transistor 20, and the vertical NPN bipolar transistor 30 will be described with reference to FIG. 1 in detail.

Field insulating films 2 for electrically separating these transistors is formed on a surface of the P-type semiconductor substrate 1. A first N-well 3A and a second N-well 3B are simultaneously and deeply formed on the surface of the P-type semiconductor substrate 1 in the same step. Accordingly, the two wells have substantially the same impurity concentration profile. The first N-well 3A and the second N-well 3B are approximately 4 micrometers in depth from the surface of the P-type semiconductor substrate 1. A first P-well 4A is formed in the first N-well 3A, and the N-channel MOS transistor 10 is formed in the first P-well 4A. The first P-well 4A is formed shallower than the first N-well 3A, and its depth is 1 to 2 micrometers for example. On the surface of the first P-well 4A, an N+ source layer 11, an N+ drain layer 12, a gate insulating film, a gate electrode 13 on the gate insulating film and a P+ layer 14 for setting an electric potential of the first P-well 4A are formed to form the N-channel MOS transistor 10.

The second N-well 3B is used as a collector of the vertical NPN bipolar transistor 30. A second P-well 4B is formed in the second N-well 3B. The second P-well 4B is formed simultaneously with the first P-well 4A in the same step. Accordingly, the two wells have substantially the same impurity concentration profile. The second P-well 4B is used as a base of the vertical NPN bipolar transistor 30. On the surface of the second P-well 4B, an N+ emitter layer 31 and a P+ base electrode 32 are formed.

A gate electrode 33 is formed between the emitter layer 31 and the base electrode layer 32 through the gate insulating film. The gate electrode 33 is connected with the emitter layer 31. Furthermore, an N+ collector layer 34 is formed on the surface of the second N-well 3B. The emitter layer 31 and the base electrode layer 32 are formed by ion implantation by using the gate electrode 33 as a mask so that a distance between the base electrode layer 32 and the emitter layer 31 is determined by a length of the gate electrode 33.

A fourth N-well 5A is formed in the first N-well 3A, and the P-channel MOS transistor 20 is formed in the fourth N-well 5A. The fourth N-well 5A is formed shallower than the first N-well 3A, and its depth is 1 to 2 micrometers, for example. On the surface of the fourth N-well 5A, a P+ source layer 21, a P+ drain layer 22, a gate insulating film, a gate electrode 23 on the gate insulating film and an N+ layer 24 for setting an electric potential of the fourth N-well 5A are formed to form the P-channel MOS transistor 20.

Next, a structure and a manufacturing method of the lateral NPN bipolar transistor 40, the lateral PNP bipolar transistor 50 and the vertical PNP bipolar transistor 60 will be described with reference to FIG. 2 in detail.

The field insulating films 2 for electrically separating these transistors are formed on the surface of the P-type semiconductor substrate 1. The lateral NPN bipolar transistor 40 will be described first. A third N-well 3C is formed on the surface of the P-type semiconductor substrate 1. The third N-well 3C is formed simultaneously with the above-described first N-well 3A and second N-well 3B in the same step. Accordingly, the two wells have substantially the same impurity concentration profile. A third P-well 4C is formed in the third N-well 3C. The third P-well 4C is also formed simultaneously with the above-described first P-well 4A and second P-well 4B in the same step. Accordingly, the three wells have substantially the same impurity concentration profile. The lateral NPN bipolar transistor 40 is formed in the third N-well 3C. The third P-well 4C is used as a base of the lateral NPN bipolar transistor 40. An N+ emitter layer 41 and an N+ collector layer 42 are formed on the surface of the third P-well 4C.

A gate electrode 43 is formed between the emitter layer 41 and the collector layer 42 through the gate insulating film. The gate electrode 43 is connected with the emitter layer 41. Furthermore, a P+ base layer 44 is formed on the surface of the third P-well 4C. The emitter layer 41 and the collector layer 42 are formed by ion implantation by using the gate electrode 43 as a mask so that a distance between the emitter layer 41 and the collector layer 42, i.e. a base width is determined by a length of the gate electrode 43. An N+ layer 45 for setting an electric potential of the third N-well 3C is formed on the surface of the third N-well 3C.

Next, the lateral PNP bipolar transistor 50 will be described. A fifth N-well 5B is formed simultaneously with the fourth N-well 5A in the same step, and used as a base of the lateral PNP bipolar transistor 50. Accordingly, the two wells have substantially the same impurity diffusion depth.

A P+ emitter layer 51 and a P+ collector layer 52 are formed on the surface of the fifth N-well 5B. A gate electrode 53 is formed between the emitter layer 51 and the collector layer 52 through the gate insulating film. The gate electrode 53 is connected with the emitter layer 51. Furthermore, an N+ base layer 54 is formed on the surface of the fifth N-well 5B. The emitter layer 51 and the collector layer 52 are formed by ion implantation by using the gate electrode 53 as a mask so that a distance between the emitter layer 51 and the collector layer 52, i.e. a base width, is determined by a length of the gate electrode 53. A P+ layer 55 for setting a substrate electric potential is formed on the surface of the P-type semiconductor substrate 1 adjacent to the fifth N-well 5B.

Next, the vertical PNP bipolar transistor 60 will be described. A sixth N-well 5C is formed simultaneously with the fourth N-well 5A and the fifth N-well 5B in the same step, and used as a base of the vertical PNP bipolar transistor 60. Accordingly, the three wells have substantially the same impurity diffusion depth.

A P+ emitter layer 61 and an N+ base electrode layer 62 are formed on the surface of the sixth N-well 5C. A gate electrode 63 is formed between an emitter layer 61 and a base electrode layer 62 through a gate insulating film. The gate electrode 63 is connected with the emitter layer 61. The emitter layer 61 and the base electrode layer 62 are formed by ion implantation by using the gate electrode 63 as a mask so that a distance between the emitter layer 61 and the collector layer 62 is determined by a length of the gate electrode 63. A P+ collector layer 64 is formed on the surface of the P-type semiconductor substrate 1 adjacent to the sixth N-well 5C.

Next, a manufacturing method of the semiconductor device of the embodiment will be described. First, the first N-well 3A, the second N-well 3B, and the third N-well 3C are formed on the surface of the semiconductor substrate 1 such as a P-type silicon substrate etc. This step is performed by ion implantation of phosphorus and then thermal diffusion, for example.

Next, the field insulating films 2 are formed by a LOCOS method (local oxidation of silicon). Then, the first P-well 4A, the second P-well 4B, the third P-well 4C, the fourth N-well 5A, the fifth N-well 5B and the sixth N-well 5C are formed. The P-wells 4A, 4B, and 4C, and the N-wells 5A, 5B and 5C are severally formed by respective ion implantations and then performed with thermal diffusion. The thermal diffusion can be performed to the P-wells and the N-wells simultaneously, or performed to each of the P-wells and the N-wells after each of the ion implantations.

Then, the gate insulating film is formed by thermal oxidation, and if necessary, channel ion implantations are performed for the N-channel MOS transistor 10 and the P-channel MOS transistor 20. Then, the gate electrodes 13, 23, 33, 43, 53, and 63 are formed on the gate insulating film. These gate electrodes are formed of a polysilicon layer or a polycide layer.

Then, the N+ layer is formed by ion implantation of N-type impurity such as phosphorus or arsenic. The N+ layer includes the described source layer 11 of the N-channel MOS transistor 10, the N+ layer 24 of the P-channel MOS transistor 20, the emitter layer 31 of the vertical NPN bipolar transistor 30, the collector layer 34, the emitter layer 41 of the lateral NPN bipolar transistor 40, the collector layer 42, the N+ layer 45, the base layer 54 of the lateral PNP bipolar transistor 50 and the base electrode layer 62 of the vertical PNP bipolar transistor 60.

Furthermore, the P+ layer is formed by ion implantation of P-type impurity such as boron or boron difluoride. The P+ layer includes the P+ layer 14 of the described N-channel MOS transistor 10, the source layer 21 of the P-channel MOS transistor 20, the drain layer 22, the base electrode layer 32 of the vertical NPN bipolar transistor 30, the base layer 44 of the lateral NPN bipolar transistor 40, the emitter layer 51 of the lateral PNP bipolar transistor 50, the collector layer 52, the emitter layer 61 of the vertical PNP bipolar transistor 60, and the collector layer 64.

In this embodiment, four kinds of bipolar transistors, i.e. the vertical NPN bipolar transistor 30, the lateral NPN bipolar transistor 40, the lateral PNP bipolar transistor 50, and the vertical PNP bipolar transistor 60 as well as a CMOS can be formed on the same semiconductor substrate 1 by a CMOS triple-well process without performing additional process steps of the conventional art.

Figure 3:
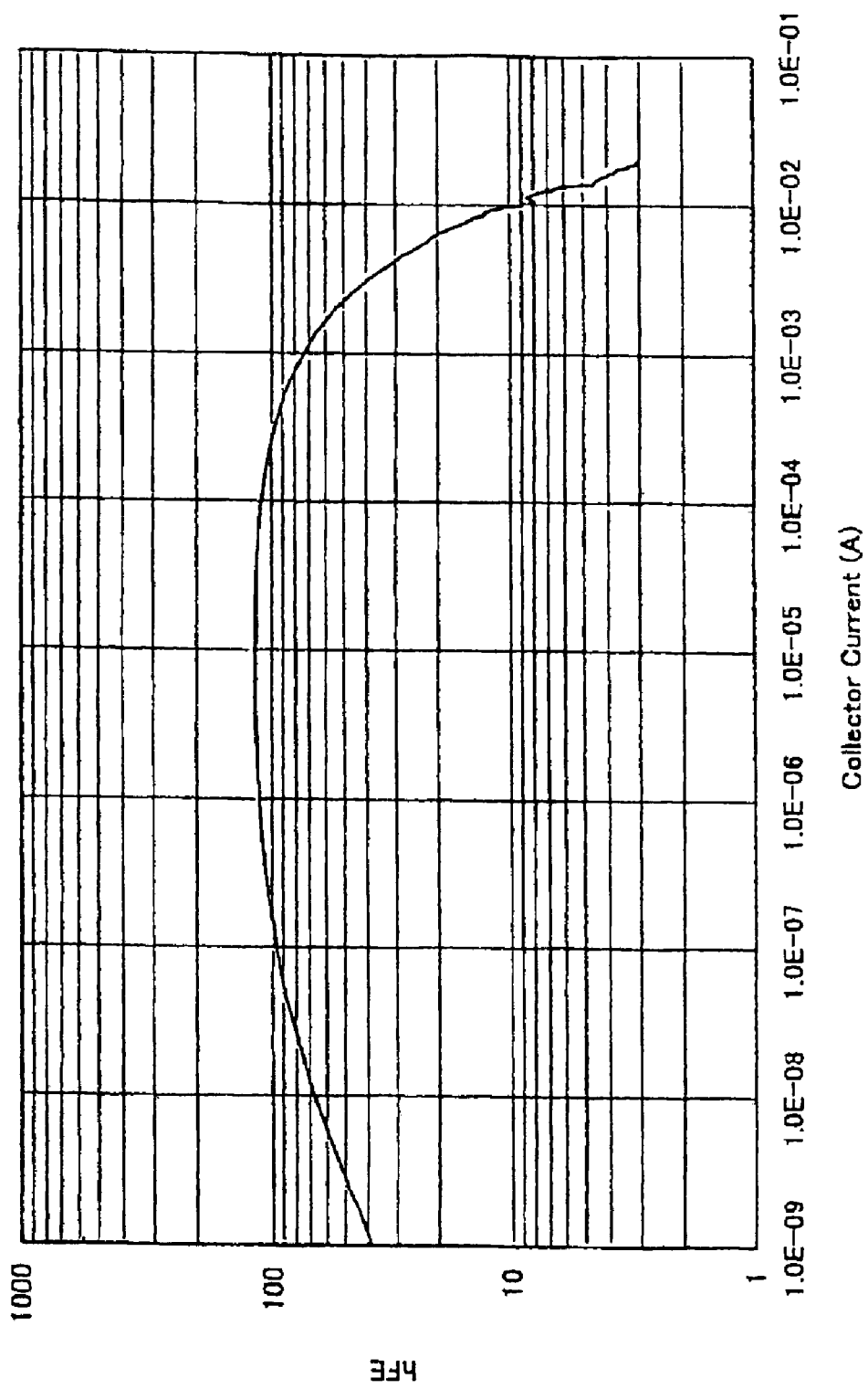
FIG. 3 shows characteristics of a vertical NPN bipolar transistor of the embodiment of the invention.

FIG. 3 shows characteristics of the described vertical NPN bipolar transistor 30. A lateral axis shows a collector current, and a vertical axis shows a current amplification factor hFE. As apparent from FIG. 3, the current amplification factor hFE is 100 and cutoff frequency is 1 GHz, so that superior characteristics to a bipolar process can be obtained.

What is claimed is:

1. A semiconductor device comprising:
   a P-type semiconductor substrate;
   a first N-well formed on a surface of the P-type semiconductor substrate
   a P-channel transistor formed in the first N-well;
   a first P-well formed in the first N-well;
   a N-channel transistor formed in the first P-well; and
   a second N-well formed apart from the first N-well on the P-type semiconductor substrate, the second N-well and the first N-well having substantially a same impurity concentration profile; and
   a vertical NPN bipolar transistor formed in the second N-well and using the second N-well as a collector of the vertical NPN bipolar transistor.

2. The semiconductor device of claim 1, further comprising a second P-well formed in the second N-well that has substantially a same impurity concentration profile as the first P-well, wherein the second P-well is configured to be a base of the vertical NPN bipolar transistor.

3. The semiconductor device of claim 1, further comprising a third N-well formed on the surface of the P-type semiconductor substrate that has substantially a same impurity concentration profile as the first and second N-wells, a third P-well formed in the third N-well that has substantially a same impurity concentration profile as the first P-well, and lateral NPN bipolar transistor formed on the third P-well and using the third P-well as a base of the lateral NPN bipolar transistor.

4. The semiconductor device of claim 1, further comprising a fourth N-well formed in the first N-well that is shallower than the first N-well, the P-channel transistor being formed in the fourth N-well, a fifth N-well formed on the P-type semiconductor substrate that has substantially a same impurity diffusion depth as the fourth N-well, and a lateral PNP bipolar transistor formed on the fifth N-well and using the fifth N-well as a base of the lateral PNP bipolar transistor.

5. The semiconductor device of claim 1, further comprising a fourth N-well formed in the first N-well that is shallower than the first N-well, the P-channel transistor being formed in the fourth N-well, a sixth N-well formed on the P-type semiconductor substrate that has substantially a same impurity diffusion depth as the fourth N-well, and a vertical PNP bipolar transistor formed on the sixth N-well and using the sixth N-well as a base of the vertical PNP bipolar transistor.

* * * * *